United States Patent
Butzmann

(10) Patent No.: US 8,143,884 B2
(45) Date of Patent: Mar. 27, 2012

(54) CURRENT INTERFACE WITH A BLOCKING CAPACITOR ATTACHED TO AN ADDITIONAL PIN

(75) Inventor: Stefan Butzmann, Hamburg (DE)

(73) Assignee: NXP B.V., Eindhoven (NL)

( * ) Notice: Subject to any disclaimer, the term of this patent is extended or adjusted under 35 U.S.C. 154(b) by 374 days.

(21) Appl. No.: 12/300,375

(22) PCT Filed: May 3, 2007

(86) PCT No.: PCT/IB2007/051657
§ 371 (c)(1),
(2), (4) Date: Apr. 21, 2009

(87) PCT Pub. No.: WO2007/132389
PCT Pub. Date: Nov. 22, 2007

(65) Prior Publication Data
US 2009/0262860 A1    Oct. 22, 2009

(30) Foreign Application Priority Data
May 12, 2006  (EP) .................................. 061138384

(51) Int. Cl.
*G01R 33/02*  (2006.01)
*G01B 7/30*   (2006.01)

(52) U.S. Cl. ............................. 324/207.21; 324/207.25

(58) Field of Classification Search ............. 324/207.21, 324/207.25
See application file for complete search history.

(56) References Cited

U.S. PATENT DOCUMENTS

| | | | | |
|---|---|---|---|---|
| 2,571,915 A | * | 10/1951 | McCoubrey | 324/118 |
| 4,169,232 A | * | 9/1979 | Henrich | 327/79 |
| 4,682,049 A | * | 7/1987 | Kirschner et al. | 327/165 |
| 4,727,323 A | * | 2/1988 | Zabler | 324/252 |
| 4,866,298 A | * | 9/1989 | Kniss et al. | 327/58 |
| 4,868,909 A | * | 9/1989 | Lowel | 324/225 |
| 5,315,260 A | * | 5/1994 | Link et al. | 327/184 |
| 5,455,510 A | * | 10/1995 | Nelson | 324/252 |
| 5,970,794 A | * | 10/1999 | Yoshida | 73/514.09 |
| 6,140,940 A | | 10/2000 | Kloefer et al. | |
| 6,144,197 A | * | 11/2000 | Shimamura et al. | 324/166 |
| 6,204,715 B1 | * | 3/2001 | Sellnau et al. | 327/309 |
| 6,225,802 B1 | * | 5/2001 | Ramalho et al. | 324/252 |
| 6,232,770 B1 | * | 5/2001 | Schroeder | 324/207.21 |
| 6,268,721 B1 | * | 7/2001 | Schroeder et al. | 324/207.25 |

(Continued)

OTHER PUBLICATIONS

Robert E. Simpson, Introductory Electronics for Scientists and Engineers, 1987, Allyn and Bacon, Inc, Second Edition, pp. 187-189.*

(Continued)

*Primary Examiner* — Reena Aurora

(57) ABSTRACT

It is described a current interface (100, 200) with a blocking capacitor (128, 228). The blocking capacitor (128, 228) is attached to an additional pin (115, 215), thus allowing a supply voltage ripple rejection of an internal sensor circuit (130, 230). The supply lines (160, 260, 170, 270) are decoupled from the capacitor (128, 228) by a diode (125) or by a voltage regulator (226). Thereby, the use of a sensor element (132, 232) with the current interface (100, 200) does not restrict the size of the blocking capacitor (128, 228) because transient times of edges of output current signals of the current interface (100, 200) are not affected by a low-pass behavior of the blocking capacitor (128, 228) combined with a sensing resistor (171, 271) being typically used for measuring the amperage of the output current signals.

10 Claims, 2 Drawing Sheets

U.S. PATENT DOCUMENTS

| | | | |
|---|---|---|---|
| 6,291,989 B1 * | 9/2001 | Schroeder | 324/207.21 |
| 6,310,474 B1 * | 10/2001 | Schroeder | 324/207.25 |
| 6,442,502 B1 * | 8/2002 | Lohberg et al. | 702/145 |
| 6,456,063 B1 * | 9/2002 | Moreno et al. | 324/207.12 |
| 6,703,943 B1 * | 3/2004 | Lalla et al. | 340/870.39 |
| 6,727,689 B1 * | 4/2004 | Furlong et al. | 324/207.25 |
| 6,759,843 B2 * | 7/2004 | Furlong | 324/207.2 |
| 6,847,204 B1 * | 1/2005 | Duance | 324/207.2 |
| 7,323,864 B2 * | 1/2008 | Teulings et al. | 324/207.2 |
| 7,528,597 B2 * | 5/2009 | Taylor et al. | 324/207.15 |
| 2003/0137261 A1 | 7/2003 | Marshall et al. | |
| 2006/0091879 A1 * | 5/2006 | Hara | 324/207.2 |
| 2007/0176598 A1 * | 8/2007 | Thomas et al. | 324/207.25 |
| 2007/0249304 A1 * | 10/2007 | Snelgrove et al. | 455/127.2 |
| 2010/0246221 A1 * | 9/2010 | Sahu | 363/78 |

OTHER PUBLICATIONS

Microelectronic Circuits, Sedra and Smith, Fifth Edition, Oxford University Press New York 2004, pg. 163.*

Maxim/Dallas; "Application Note 695"; New ICS Revolutionize the Senor Interface.

* cited by examiner

CURRENT INTERFACE WITH A BLOCKING CAPACITOR ATTACHED TO AN ADDITIONAL PIN

The present invention relates to the field of current interfaces for sensor elements. In particular the present invention relates to a current interface for providing an output current signal controlled by a sensor input signal.

Current interfaces provide significant advantages for the transmission of digital data in comparison to voltage interfaces. Probably the most important advantage is the fact that a current interface requires only two wires. Typically, a current interface employs one wire for extracting an input current from a supply voltage level and the other wire is employed for outputting an output current to an evaluation unit. The evaluation unit measures the amperage of the provided output current.

By contrast to voltage interfaces, which typically require at least three wires, namely a first wire for providing a constant supply voltage level, a second wire for providing a reference voltage level such as ground level and a third wire for providing a data signal, current interfaces allow for economizing at least one wire. This is in particular beneficial if a sensor element is located far away from a corresponding evaluation unit and/or if within a limited space a plurality of sensor elements have to be coupled with an evaluation unit.

However, there are applications for sensors being coupled to current interfaces, which applications require very high measurement accuracies. Thereby, unwanted voltage fluctuations may cause a wrong or a non-precise signal conditioning carried out within a current interface.

It is know to compensate such unwanted voltage fluctuations by providing a blocking capacitor, which is connected in between the two wires being necessary for current interfaces. However, this has the drawback that the response time of the current interface is decreased significantly because the blocking capacitor in conjugation with a sensing resistor represents a low-pass filter. Therefore, current interfaces for high accuracy measurements are not suitable for applications wherein a fast changing output current has to be provided.

There may be a need for providing a current interface, which allows for both a high accuracy signal conditioning and a fast response.

This need may be met by the subject matter according to the independent claim. Advantageous embodiments of the present invention are described by the dependent claims.

1#According to an aspect of the invention there is provided a current interface for providing an output current signal controlled by a sensor input signal. The provided current interface comprises (a) a first supply pin, which adapted to be connected to a supply voltage, (b) a second supply pin, which is adapted for providing the output current signal, (c) a current source, which is connected in between the first supply pin and the second supply pin, (d) an additional pin, which is adapted to be connected to one of the two supply pins by means of a blocking capacitor, and (e) a decoupling device, which is connected in between the additional pin and the other of the two supply pins.

This aspect of the invention is based on the idea that the blocking capacitor is separated or decoupled at least partially from the current source. Thereby, the separation is carried out in such a manner that the current interface may still be operated by means of two supply lines only, which supply lines are connected to the two supply pins.

In other words, the decoupling device is adapted to decouple or separate at least partially the voltage signal being present at the other of the first and the second supply pin from the voltage signal being present at the additional pin. Therefore, the voltage signal being present at the additional pin may be kept very stable by means of the blocking capacitor whereas the output current signal is not limited by a typical low-pass behavior.

This means that on the one hand the power supply is provided with a blocking capacitor having the advantage that unwanted voltage peaks on one of the supply lines might be blocked from sensitive parts of the current interface. One the other hand, the low-pass filter does not affect the output current signal such that also abrupt changes of the amperage of the output current may be employed for a data evaluating of signals being transmitted from the provided current source.

Preferably, the blocking capacitor is an external blocking capacitor. This has the advantage that also when the current interface is realized within one or more integrated circuits being accommodated in a single chip housing, the capacitance of the blocking capacitor may be optimized with respect to the specific application of the current interface. Typical values for the capacitance are approximately 1 to 1000 nF and preferably 10 to 500 nF. Such blocking capacitors allow for a reliable protection of sensitive components of the current interface from e.g. electro static discharge events or other voltage fluctuations being present at the supply pins.

2#According to an embodiment of the present invention the current interface further comprises a signal-conditioning unit, which is coupled to the current source in order to provide for a control signal to the current source. This has the advantage that the sensor interface may be realized within a compact design.

3#According to a further embodiment of the present invention the signal-conditioning unit is adapted for providing digital control signals to the current source. This has the advantage that a digital current interface is provided which allows for a precise and reliable signal conditioning.

4#According to a further embodiment of the present invention the signal-conditioning unit is powered by a supply voltage, which is being present between the first supply pin and the additional pin. This has the advantage that the signal-conditioning unit is automatically protected from voltage peaks being present at the first and/or at the second supply pin. Therefore, highly accurate and as a consequence also very sensitive signal-conditioning units may be used without increasing the risk of introducing errors or discrepancies in the signal conditioning and signal propagation due to unwanted voltage fluctuations.

Of course, depending on the actual operational state of the current interface the supply voltage for the signal-conditioning unit may vary in time. However, the supply voltage for the current interface should be dimensioned in such a manner that independent from the actual operational state the supply voltage is always big enough in order to allow for a correct operation of the signal-conditioning unit.

5#According to a further embodiment of the present invention the current interface further comprises a sensor element. This has the advantage that both a reliable and a fast sensor package may be realized within a compact design, wherein the whole sensor package may be operated with two supply wires only.

By contrast thereto, sensors being included in voltage interfaces typically require three wires namely a supply voltage wire, a reference voltage or ground wire and a wire for transmitting analog or digital data signals. Therefore, the described current interface allows for a saving of one wire.

6#According to a further embodiment of the present invention the sensor element is formed integrally with the signal-conditioning unit. This may be realized by a variety of different types of sensor elements and/or signal-conditioning units.

In this context "integrally" means that one package is provided for accommodating both the sensor element and the signal-conditioning unit. Thereby, the sensor element and the signal-conditioning unit may be formed by means of one or by means of two or even more integrated circuits.

7#According to a further embodiment of the present invention the sensor element is an angular sensor, in particular the sensor element is a magneto resistive angular sensor. This has the advantage that a complete sensor package may be provided which is capable of both generating precise angular signals and conditioning these signals into digital current signals, which allow for a reliable data evaluation by means of a data evaluation unit arranged downstream with respect to the current interface.

Preferably, the angular signals are analog sensor signals, which by contrast to digital signals allow for a much more precise angular resolution. By conditioning and evaluating these analog sensor signals in an appropriate manner an angular resolution of approximately 0.02° to 0.04° within an angular range may be achieved with an appropriate data evaluation e.g. based on known interpolation techniques.

It has to be mentioned that the described current interface may also be employed in connection with other types of sensors such as temperature sensors, magnetic field sensors etc.

8#According to a further embodiment of the present invention the first supply pin, the second supply pin and the additional pin are the only pins being provided. This has the advantage that it is always ensured that the amperage of the current flowing into the current interface via a wire being connected to the first supply pin has exactly the same amperage as the current flowing out from the current interface via a wire being connected to the second supply pin. Therefore, the two wires may be spatially arranged with respect to each other in such a manner that no or only negligible electromagnetic pollution may be generated in the region surrounding the two wires.

Preferably, the two wires comprise a twisted configuration such that even high frequency current signals having significant amperages do not or do not significantly generate electromagnetic pollution. This allows for arranging the described current interface in close proximity to devices having a reduced electromagnetic compatibility.

A further advantage of the described current interface is the matter of fact that a loss of power of the sensor element will be detected inherently. Therefore, the described current interface may be used for security relevant applications such as for antilock braking systems.

9#According to a further embodiment of the present invention the decoupling device is a diode. Thereby, the diode is preferably connected within the circuit arrangement representing the current interface with such a polarity that a current flowing off from a charged blocking capacitor cannot reach the current source. Therefore, the low pass filter behavior of the blocking capacitor does not act onto the current source such that also high frequency data signals may be provided by the described current interface.

It has to be mentioned that after a short voltage peak has charged the blocking capacitor a discharging is effected by a smooth current flow from the capacitor to the signal-conditioning unit. However, compared to the negative impact caused by a short voltage peak directly applied to the signal-conditioning unit, a smooth current flow into the signal-conditioning unit does typically not affect the stability of the signal conditioning unit. In other words, the blocking capacitor smoothes the voltage level which is applied to the signal-conditioning unit whereas the output signal of the current interface is not smoothened in order to provide for the possibility to transmit high frequency output current signals.

10#According to a further embodiment of the present invention the decoupling device is a voltage regulator. This has the advantage that always a constant voltage difference may be provided for the signal-conditioning unit. Therefore, the signal-conditioning unit may be operated under very stable conditions such that even in the case of voltage fluctuations within in particular the wire being connected to the first supply pin a reliable signal conditioning may be accomplished.

It has to be pointed out that with the help of the voltage regulator a constant supply voltage may also be provided if the output current comprises strong amperage fluctuations. In this case, the voltage level of the wire being connected to the second supply pin usually varies strongly because typically the output current is measured by the voltage drop caused by a sensing resistor, which is connected between this wire and ground level.

Further, it has to be pointed out that if a short voltage fluctuation at the first supply pin occurs, the voltage regulator, which is typically a rather slow electronic device, feeds through this fluctuation. However, as has already been described above, this fluctuation is smoothed by the blocking capacitor. Also in the case of using a voltage regulator the current source is decoupled at least partially from the blocking capacitor such that the blocking capacitor does not affect the high frequency behavior current interface. Therefore, as has also already been described above, the current interface may also be used for providing digital data signals for an evaluation unit being arranged downstream of the described current interface.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

The illustration in the drawing is schematically. It is noted that in different figures, similar or identical elements are provided with reference signs, which are different from the corresponding reference signs only within the first digit.

Figure 1:
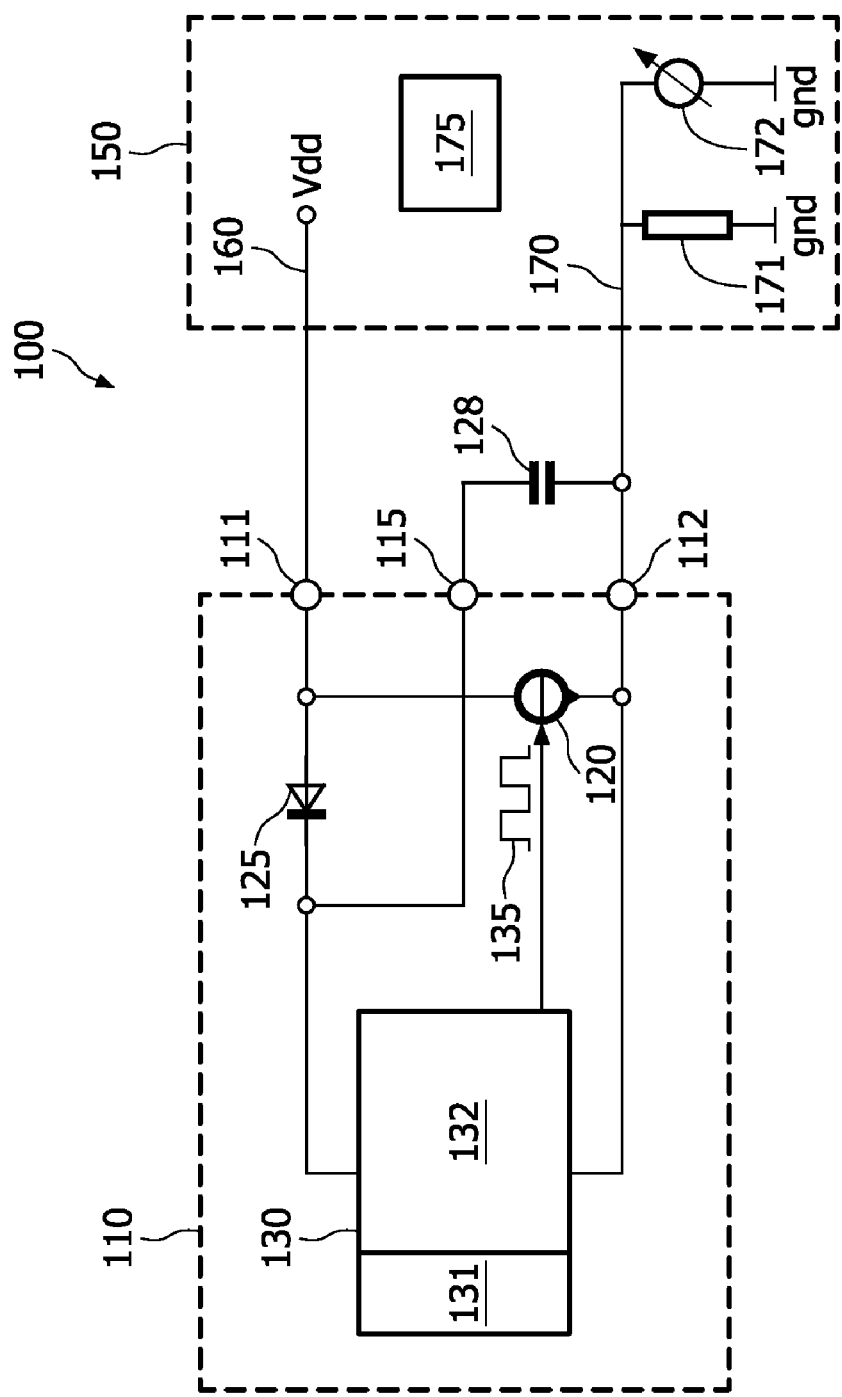
FIG. 1 shows a circuit diagram of a current interface according to a first embodiment of the invention.

FIG. 1 shows a circuit diagram of a current interface 100, which represents a complete sensor package 110. The depicted sensor package 110 is arranged integrally within a single chip package. However, the sensor package 110 may also be realized by means of different integrated circuits, which are accommodated within different chip packages.

The sensor package 110 comprises a signal generating and conditioning device 130, which includes a sensor element 131 and a signal-conditioning unit 132. According to the embodiment described herewith, the sensor element 131 is a high sensitive angular sensor, which in an advantageous manner exploits the magnetoresistive effect in order to provide for a high angular resolution within a wide angular range. The magnetoresistive sensor element 131 is an analog sensor, which provides an analog output signal to the signal-conditioning unit 132. The signal-conditioning unit 132 conditions and converts this analog signal and provides a digital control signal 135 to a current source 120. The function of the current source 120 will be described in detail later on.

The current interface 100 is electrically connected to a control and evaluation unit 150, which provides for a supply voltage Vdd. The supply voltage Vdd is fed to the current interface 100 by means of a supply conductor 160. The control and evaluation unit 150 further comprises a sensing resistor 171. The sensing resistor 171 is connected in between a ground voltage level and a signal conductor 170, which receives a current signal from the current interface 100. Thereby, the current signal represents an angular position measured by the sensor element 131.

The current signal causes a voltage drop at the sensing resistor 171, which voltage drop is proportional to the actual amperage of the current signal. The voltage drop is measured by means of a voltage drop measurement device 172, which is e.g. an oscilloscope or any other voltage measurement device. The measured voltage signal is provided to a data processing device 175 for further data evaluation.

It has to be pointed out that the control and evaluation unit 150 may also be realized by means of various other current measurement devices, which are well known by persons skilled in the art. For instance the current measurement may be carried out with a device comprising a current mirror. This has the advantage the signal conductor 170 is at least partially decoupled from the real current measurement instrument.

The current interface 100 comprises three pins, a first supply pin 111, a second supply pin 112 and an additional pin 115. The first supply pin 111 is connected to the supply voltage Vdd. The second supply pin 112 is connected to the signal conductor 170.

Within the current interface 100 the current source 120 is interconnected with the first supply pin 111 and with the second supply pin 112. Outside the current interface 100 there is provided a blocking capacitor 128, which is inserted in between the additional pin 115 and the second supply pin 112. The arrangement of the blocking capacitor 128 outside the sensor package 110 has the advantage that the capacitance of the blocking capacitor 128 may be optimized with respect to the specific application of the described current interface 100. According to the embodiment described here the blocking capacitor 128 has a capacitance of approximately 100 nF.

The current interface 100 further comprises a diode 125, which is connected in between the first supply pin 111 and the second supply pin 112.

As can be directly seen from the circuit arrangement depicted in FIG. 1, the blocking capacitor 128 will protect the signal generating and conditioning device 130 from voltage fluctuations being present at the cathode of the diode 125. Thereby, a smooth supply voltage for the signal generating and conditioning device 130 is ensured. In the absence of such voltage fluctuations the signal generating and conditioning device 130 will be able to provide for both very sensitive signal generation and a very sensitive signal conditioning. Therefore, an error-free signal conditioning of the signals being generated by the sensor element 131 can be ensured.

The diode 125 has the effect that the current source 120 is decoupled from the blocking capacitor 128. This is realized by employing the additional pin 115, which is connected to the external blocking capacitor 128. Therefore, the diode 125 decouples the blocking capacitor 128 from the supply pins 111 and 112 in such a manner the integrated current source 120 is capable of drawing current directly from the supply line 160 and not from the blocking capacitor 128 when being charged. Thus, the circuit permits the implementation of a two-wire current interface 100, where the information is transmitted via different current levels, while simultaneously providing a supply voltage ripple rejection for the internal circuitry via the external blocking capacitor 128 connected to the additional output pin 115.

The described configuration comprising the additional pin 115 for connecting the capacitor 128 has the advantage, that in case of a high frequency control signal 135 being provided to the current source 120, the output current signal being provided by the current source 120 is not affected by a low-pass frequency behavior caused by the blocking capacitor 128 in conjugation with the sensing resistor 171. In other words, when the integrated current source 120 switches from one current-level to another current-level, the resistor 171 and the blocking capacitor 128 do not represent a low-pass filter. Therefore, the voltage over the sensing resistor 171 will change relatively fast such that the edges of any digital signal output at the pin 112 is not degraded because of low-pass filter limitations.

It is pointed out that the decoupling of the current source 120 from the blocking capacitor 128 is realized without increasing the number of supply wires 160, 170 connecting the current interface 100 with the control and evaluation unit 150. As can be seen from FIG. 1, the described sensor package 110 may still be operated with two supply lines 160, 170 only.

It is further pointed out that the decoupling of the blocking capacitor 128 from the current source 120 could also be realized if the diode 125 would be arranged within the low power supply line i.e. the conductor between the signal generating and conditioning device 130 and the second supply pin 112.

Figure 2:
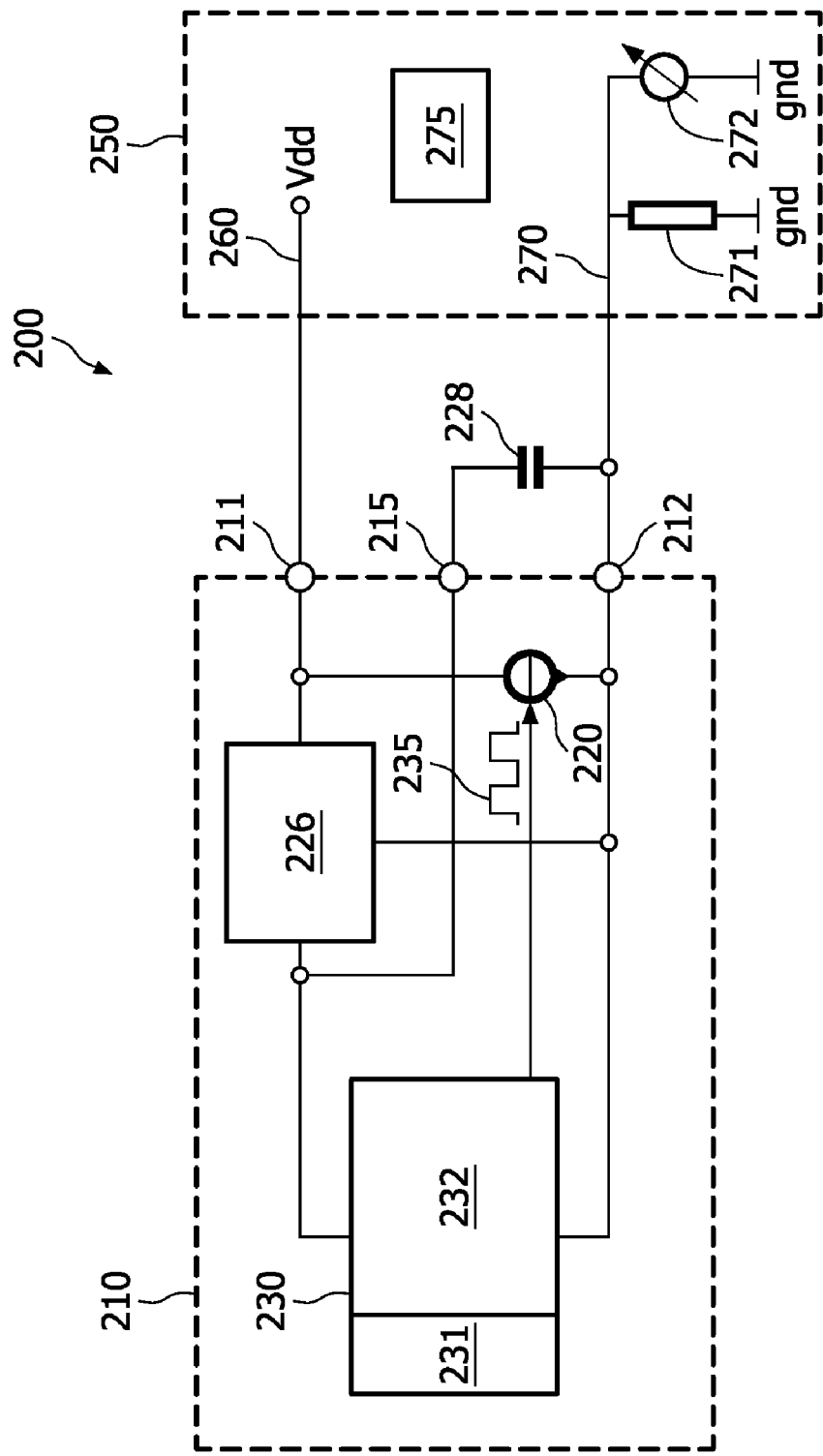
FIG. 2 shows a circuit diagram of a current interface according to a second embodiment of the invention.

FIG. 2 shows a circuit diagram of a current interface 200 according to a further embodiment of the invention. Apart from the diode 125, which is replaced by a voltage regulator 226, the components of the current interface 200 are identical to the components of the of the current interface 100 and will thus not be described once again in detail. The same holds for the control and evaluation unit 250, which is identical to the control and evaluation unit 150.

The voltage regulator 226 comprises three terminals. A first terminal is connected to the first supply pin 211. A second terminal is connected to the signal generating and conditioning device 230. A third terminal is connected to the second supply pin 212. The voltage regulator 226 is used in order to stabilize the voltage over the signal generating and conditioning device 230. Therefore, unwanted voltage fluctuations may also be kept away from the signal generating and conditioning device 230 such that it is possible to provide for both a very sensitive signal generation and a very sensitive signal conditioning.

The voltage regulator 226 has also the effect that current can only flow from the first supply pin 211 to the signal generating and conditioning device 230 and not in the opposite direction from the signal generating and conditioning device 230 to the first supply pin 211. Therefore, also the voltage regulator 226 has the effect that the blocking capacitor 228 is decoupled from the current source 220 such that the output signal of the current source 220 is not limited by a low-pass filter behavior.

It is pointed out that the decoupling of the blocking capacitor 228 from the current source 220 could also be realized if the voltage regulator 226 would be arranged within the low power supply line i.e. the conductor between the signal generating and conditioning device 230 and the second supply pin 212.

It is further pointed out that the described sensor package 110, 210 may be used for any application, where information is transmitted digitally via a current interface. However, the described decoupling of the blocking capacitor 128, 228 from the current source 120, 220 is in particular suitable for magnetoresistive angular sensors, which one the one hand require a reliable blocking of voltage fluctuations from the signal generating and conditioning device 130, 230 and one the other hand allows for a signal output being not degenerated due to a low-pass behavior.

It should be noted that the term "comprising" does not exclude other elements or steps and the "a" or "an" does not exclude a plurality. Also elements described in association with different embodiments may be combined. It should also be noted that reference signs in the claims should not be construed as limiting the scope of the claims.

In order to recapitulate the above described embodiments of the present invention one can state:

It is described a current interface 100, 200 with a blocking capacitor 128, 228. The blocking capacitor 128, 228 is attached to an additional pin 115, 215, thus allowing a supply voltage ripple rejection of an internal sensor circuit 130, 230. The supply lines 160, 260, 170, 270 are decoupled from the capacitor 128, 228 by a diode 125 or by a voltage regulator 226. Thereby, the use of a sensor element 132, 232 with the current interface 100, 200 does not restrict the size of the blocking capacitor 128, 228 because transient times of edges of output current signals of the current interface 100, 200 are not affected by a low-pass behavior of the blocking capacitor 128, 228 combined with a sensing resistor 171, 271 being typically used for measuring the amperage of the output current signals.

LIST OF REFERENCE SIGNS

100 current interface
110 sensor package
111 first supply pin
112 second supply pin
115 additional pin
120 current source
125 diode
128 blocking capacitor
130 signal generating and conditioning device
131 sensor element
132 signal-conditioning unit
135 digital control signal
150 control and evaluation unit
160 supply conductor
170 signal conductor
171 sensing resistor
172 voltage drop measuring device
175 data processing device
Vdd supply voltage
gnd reference voltage level/ground level
200 current interface
210 sensor package
211 first supply pin
212 second supply pin
215 additional pin
220 current source
226 voltage regulator
228 blocking capacitor
230 signal generating and conditioning device
231 sensor element
232 signal-conditioning unit
235 digital control signal
250 control and evaluation unit
260 supply conductor
270 signal conductor
271 sensing resistor
272 voltage drop measuring device
275 data processing device
Vdd supply voltage
gnd reference voltage level/ground level

The invention claimed is:

1. A current interface for providing an output current signal controlled by a sensor input signal, the current interface comprising:
a first supply pin, adapted to be connected to a supply voltage;
a second supply pin, adapted for providing the output current signal;
a current source, which is connected in between the first supply pin and the second supply pin;
a blocking capacitor disposed between an additional pin and one of the two supply pins; and
a decoupling device, which is connected in between the additional pin and the other of the two supply pins, said decoupling device configured to separate the blocking capacitor from the other of the two supply pins;
wherein the additional pin is separated from the current source via the decoupling device and the blocking capacitor.

2. The current interface as set forth in claim 1, further comprising:
a signal-conditioning unit, which is coupled to the current source in order to provide for a control signal to the current source.

3. The current interface as set forth in claim 2, wherein the signal-conditioning unit is adapted for providing digital control signals to the current source.

4. The current interface as set forth in claim 2, wherein the signal-conditioning unit is powered by a supply voltage being present between the first supply pin and the additional pin.

5. The current interface as set forth in claim 2, further comprising a sensor element.

6. The current interface as set forth in claim 5, wherein the sensor element is formed integrally with the signal-conditioning unit.

7. The current interface as set forth in claim 5, wherein the sensor element is an angular sensor, in particular the sensor element is a magneto resistive angular sensor.

8. The current interface as set forth in claim 2, wherein the first supply pin, the second supply pin and the additional pin are the only pins being provided.

9. The current interface as set forth in claim 1, wherein the decoupling device is a diode.

10. The current interface as set forth in claim 1, wherein the decoupling device is a voltage regulator.

* * * * *